(12) United States Patent
Treusch et al.

(10) Patent No.: US 7,058,101 B2
(45) Date of Patent: Jun. 6, 2006

(54) STEPPED MANIFOLD ARRAY OF MICROCHANNEL HEAT SINKS

(75) Inventors: Hans-Georg Treusch, Tucson, AZ (US); Raman Srinivasan, Tucson, AZ (US)

(73) Assignee: Spectra Physics, Inc., Tucson, AZ (US)

( * ) Notice: Subject to any disclaimer, the term of this patent is extended or adjusted under 35 U.S.C. 154(b) by 179 days.

(21) Appl. No.: 10/666,999

(22) Filed: Sep. 20, 2003

(65) Prior Publication Data

US 2005/0063433 A1    Mar. 24, 2005

(51) Int. Cl.
*H01S 3/04*    (2006.01)

(52) U.S. Cl. .......................................... 372/35; 372/36

(58) Field of Classification Search ............. 372/34–36
See application file for complete search history.

(56) References Cited

U.S. PATENT DOCUMENTS

| | | | | |
|---|---|---|---|---|
| 3,622,906 | A | * | 11/1971 | Nyul ............................ 257/88 |
| 3,760,175 | A | * | 9/1973 | Gibson et al. ............... 362/553 |
| 4,345,643 | A | | 8/1982 | Dawson ....................... 165/122 |
| 4,494,171 | A | | 1/1985 | Bland .......................... 361/386 |
| 4,716,568 | A | * | 12/1987 | Scifres et al. ................. 372/36 |
| 5,005,640 | A | | 4/1991 | Lapinski ...................... 165/160 |
| 5,099,311 | A | | 3/1992 | Bonde .......................... 357/82 |
| 5,099,910 | A | | 3/1992 | Walpole ....................... 165/80.4 |
| 5,105,430 | A | | 4/1992 | Mundinger ................... 372/35 |
| 5,107,091 | A | | 4/1992 | Wagner | |
| 5,212,707 | A | | 5/1993 | Heidel .......................... 372/50 |
| 5,228,050 | A | * | 7/1993 | LaCourse et al. ....... 372/50.121 |
| 5,311,536 | A | * | 5/1994 | Paoli et al. ............... 372/50.12 |
| 5,848,083 | A | | 12/1998 | Huden .......................... 372/36 |
| 5,987,043 | A | * | 11/1999 | Brown et al. .................. 372/36 |
| 6,229,831 | B1 | | 5/2001 | Nightingale .................. 372/36 |
| 6,240,116 | B1 | * | 5/2001 | Lang et al. .............. 372/50.12 |
| 6,295,307 | B1 | * | 9/2001 | Hoden et al. .................. 372/36 |
| 6,312,166 | B1 | | 11/2001 | Zediker ........................ 385/88 |
| 6,480,514 | B1 | | 11/2002 | Lorenzon ..................... 372/35 |
| 6,647,035 | B1 | * | 11/2003 | Freitas et al. ................. 372/36 |

FOREIGN PATENT DOCUMENTS

| DE | 2153969 | 5/1973 |
|---|---|---|
| JP | 4-264789 | 9/1992 |

* cited by examiner

*Primary Examiner*—Minsun Harvey
*Assistant Examiner*—Phillip Nguyen
(74) *Attorney, Agent, or Firm*—Howard R. Popper; Brian F. Swienton

(57) ABSTRACT

An assembly for providing a concentrated, vertically stacked array of laser beams from a horizontally offset array of electrically serially-connected metallic microchannel heat sinks each bearing a laser diode bar. The heat sinks are mounted on horizontally offset planes of the manifold which has coolant channels serving adjacent heat sinks that are separated from each to increase the electrical resistance of the fluid path between adjacent ones of said heat sinks. Stepped optical deflectors re-arrange the horizontally emitted laser beams into vertical stack.

6 Claims, 3 Drawing Sheets

STEPPED MANIFOLD ARRAY OF MICROCHANNEL HEAT SINKS

FIELD OF THE INVENTION

This invention relates to closely stacked arrays of monolithic, edge-emitting laser diode bars mounted on microchannel heat sinks for high power applications and, more particularly, to a manifold for supplying metallic microchannel heat sinks with coolant while reducing corrosion in the heat sinks.

BACKGROUND OF THE INVENTION

To obtain more optical power for industrial applications than can be provided by a single laser bar, arrays of vertically or horizontally stacked laser diode bars are typically required. Because a typical laser bar emits on the order of tens of W of heat in a very small volume, it is conventional practice to mount the laser bar on a heat sink and, more particularly, on a water-cooled microchannel heat sink whose copper channels offer a large surface area for heat transfer to the cooling water. When laser diode bars together with their microchannel heat sinks are vertically stacked for greater optical power, they are usually connected electrically in series. To connect the stack of laser bars in series, adjacent heat sinks are separated by a layer of electrically insulating material whose thickness is approximately the same as that of a laser diode bar. In such arrangements, adjacent components are placed as close together as possible to maximize the optical intensity of the emitted light beams. However, the minimum spacing between adjacent light beams emitted by the stack of laser bars is determined by the thickness of the components and the heat dissipating capacity of the stack. The best available separation between adjacent components in the stack (or array), whether the components are individual laser diodes or laser diode bars, is about 1.2 mm which is capable of producing a power density of 200 watts/sq. cm.

It has heretofore been proposed in U.S. Pat. No. 5,987,043 to increase optical power density by employing a stack of heat sinks having diode bars mounted at the ends of the heat sinks instead of at the top edges of each so that adjacent emitted light beams can be closer than the thickness of the heat sinks. Alternatively, as shown in German patent DE 2,153,969 and Japanese patent JP 4,426,789 each laser bar may be mounted on a respective step of a shared, staircase like, water-cooled heat sink. In the more recently-issued U.S. Pat. No. 6,229,831 a shared heat sink having a triangular cross-section was employed together with a triangular submount for each of the laser diode bars, the angle of the submount complementing the angle of the triangular heat sink.

Unfortunately, mounting a laser bar at the end of a microchannel heat sink, as shown in FIG. 2 of the '043 patent, is not as efficient from the standpoint of maximum heat transfer as mounting the laser bar at the top edge of the heat sink. Furthermore, vertically stacked arrays of serially-connected microchannel heat sinks leads to unexpected corrosion problems in the water path that reduce the effective life of the heat sink. On the other hand, the '831 patent states that because of the difficulty of manufacture, the use of microchannel heat sinks is not possible with a "staircase" configured array of laser bars.

SUMMARY OF THE INVENTION

In accordance with the principles of the present invention, a stair case array of copper microchannel heat sinks is made possible by the use of an insulating manifold that provides a fluid path between adjoining heat sinks that reduces corrosion of the fluid paths in the heat sinks. The manifold has a series of parallel, offset planes or steps each of which provides a fluid connection to a respective microchannel heat sink each of which advantageously may be of the type disclosed in U.S. Pat. No. 6,177,203, and which are commercially known as "Monsoon" heat sinks marketed by the assignee of the present invention. The fluid passages provided by the manifold between adjacent microchannel heat sinks are longer than in a conventional, vertically stacked array while the steps of the manifold permit the laser beams from the diode bars on the heat sinks to be spaced more closely than is possible with the conventional stacked array.

BRIEF DESCRIPTION OF THE DRAWING

The foregoing and other objects of the present invention may become more apparent from a reading of the ensuing detailed description together with the drawing in which.

DETAILED DESCRIPTION

Figure 1:
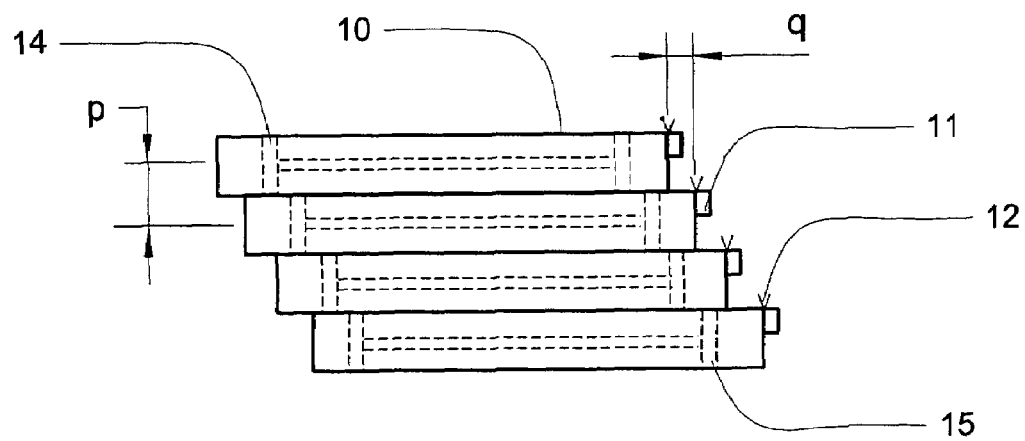
FIG. 1 shows a prior art method of vertically stacking an array of laser diodes each mounted on a respective microchannel heat sink.

FIG. 1 shows a vertical stack of microchannel heat sinks 10 each having an end-mounted laser bar 15 according to the '043 patent. End-mounting of the laser diode bars 10 allows the distance q between adjacent emitted light beams 16 to be smaller than the distance p between the center lines of adjacent heat sinks whereas mounting the laser diode bars on the top surface of each of the heat sinks determines that the distance q can be no smaller than the thickness of the heat sink. While the prior art arrangement of FIG. 1 allowed the light beams emitted by the laser diode bars to be more closely spaced, mounting the laser diode bars at the end of the microchannel heat sinks was not very efficient from the standpoint of cooling.

Unfortunately, identical microchannel heat sinks cannot be used in the configuration of FIG. 1 because, as shown, the cooling water inlets 14 and outlets 15 do not line up. This requires either that microchannel heat sinks with differently positioned inlets and outlets be used, as in FIG. 2, or that intermediate connectors be used between the heat sinks to connect the cooling water paths. It should be noted that in FIG. 2 it is necessary to use an insulating layer 27 between adjacent heat sinks 20 and it is also necessary to use an insulating standoff layer 26 between the "+" terminal 24 and heat sink 20.

The current path may be traced from the positive supply over connector 25 to positive terminal 24, wire jumper 23 to laser diode 21, copper heat sink 20, and connector strap 28 to the positive terminal 24' of the next adjacent heat sink. 20'. Although only one wire jumper 23 is shown, typically many are used. It should be noted that in FIG. 2 the fluid path between adjacent heat sinks 20, 20' has a very short length L.

Figure 2:
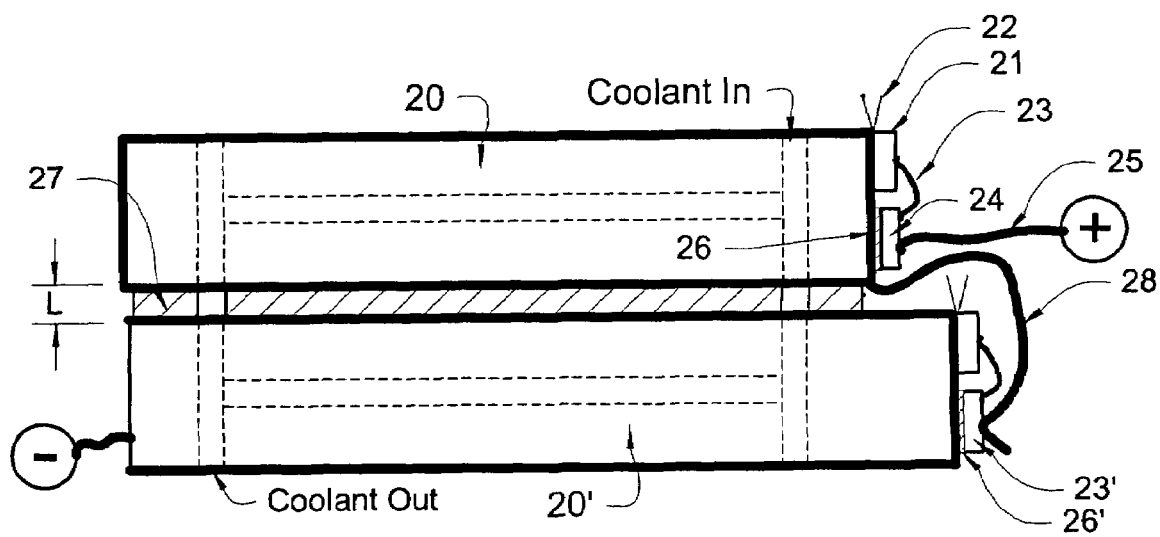
FIG. 2 shows an enlarged view of FIG. 1 modified so that the fluid paths are aligned but requiring custom built microchannel heat sinks.

In previous designs of copper, microchannel heat sink arrays little thought has apparently been given to the electrical properties of the fluid path between adjacent heat sinks. Water is the most common fluid used and water has conductivity. Even de-ionized water flowing through the copper lined channels of the heat sinks will eventually absorb copper ions leading to some degree of fluid conductivity. The usual serial connection of microchannel heat sinks, as shown in FIG. 2, determines that a potential difference will exist between adjacent heat sinks 20, 20' and, concomitantly, the fluid path within each heat sink will be at a different potential. The fluid path then transports a "leakage current" between the heat sinks. The resistance of this fluid path is given by $$R = \frac{\rho L}{A},$$

where L is the length of the fluid path between adjacent microchannel heat sinks, ρ is the resistivity of the fluid and A is the cross-sectional area of the fluid path. Assuming, for example, that the potential difference between adjacent microchannel heat sinks produces a current of one milliampere in the fluid path. One milliampere current in terms of electron flow rate is:

$$\frac{dN(e^-)}{dt} = \frac{I}{e} = \frac{10^{-3}}{1.602 \cdot 10^{-19}} = 6.24 \cdot 10^{15} \text{ electrons per second.}$$

Based on the crude approximation that each electron flowing in the fluid path will be accompanied by one atom of copper the rate of mass transfer through the fluid path is given by:

$$\frac{dm}{dt} = m_{atom} \frac{dN(e^-)}{dt}.$$

If an atom of copper weighs $1.06 \times 10^{-22}$ grams, the rate of mass transfer of copper through the fluid path is, roughly:

$$\frac{dm_{Cu}}{dt} = (6.24 \times 10^{15})(1.06 \times 10^{-22}) \simeq 6.6 \times 10^{-7} \text{ grams/sec.}$$

Accordingly, in about one hour a current of one milliampere will cause a few milligrams of copper to be transported through the fluid path. Since the microchannel heat sinks are made of very thin copper layers it is not surprising that failures have occurred in the field. Increasing the length of the fluid path by a factor of two or more will increase the resistance of the fluid path and correspondingly reduce the leakage current through the fluid path. It is an object of the present invention to provide an array of copper microchannel heat sinks having a longer fluid path between adjacent heat sinks to reduce the leakage current in the fluid path.

Figure 3:
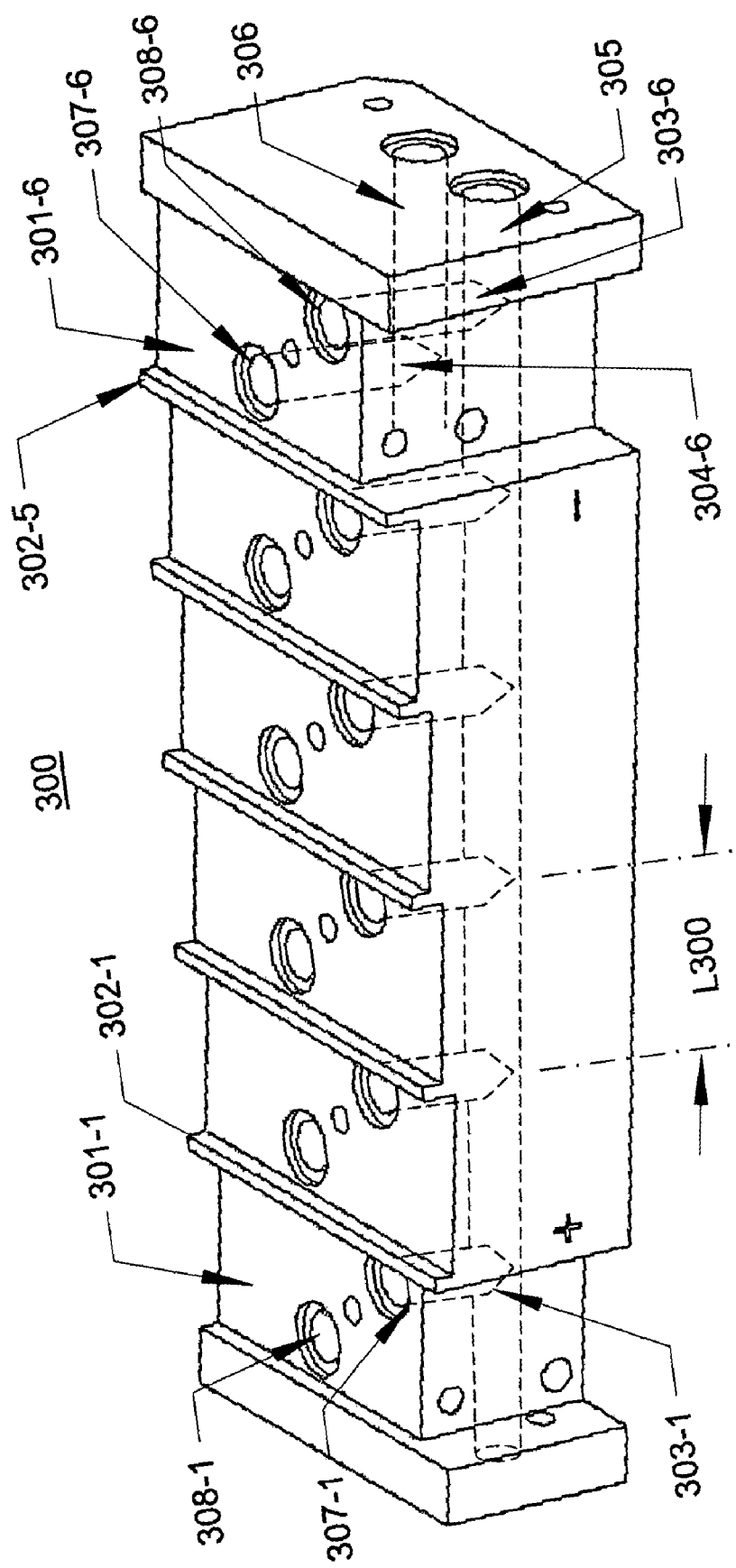
FIG. 3 is an isometric view of the manifold of the present invention having fluid paths lengthened to reduce corrosion of the copper microchannel heat sinks.

An illustrative embodiment of a manifold 300 providing a longer fluid path between adjacent microchannel heat sinks is shown in FIG. 3. Manifold 300 is advantageously fabricated of non-conductive material such as a plastic. The top surface of manifold 300 provides a series of parallel offset plane surfaces 301- through 301-6 each of which is dimensioned to accommodate a respective copper microchannel heat sink. Advantageously, the offset parallel planes are separated from one another by respective alignment walls or ridges 302-1 through 302-5 to facilitate accurate placement of the heat sinks. Each offset plane includes a vertical fluid inlet channel 303 and a fluid outlet channel 304. The fluid inlet channels between adjacent offset planes each have a length $L_{300}$ that is at least as long as the width of the respective microchannel heat sink, a length which is a multiple of the length L of FIGS. 1 and 2. The fluid inlet channels 303-1 through 303-6 are supplied through a common feeder channel 305 while the fluid outlet channels discharge into a common discharge channel 306. Advantageously, each inlet channel 303 and outlet channel terminates in an O-ring accommodating recess 307, 308 so that a fluid tight seal can be made with the respective microchannel heat sink.

Figure 4:
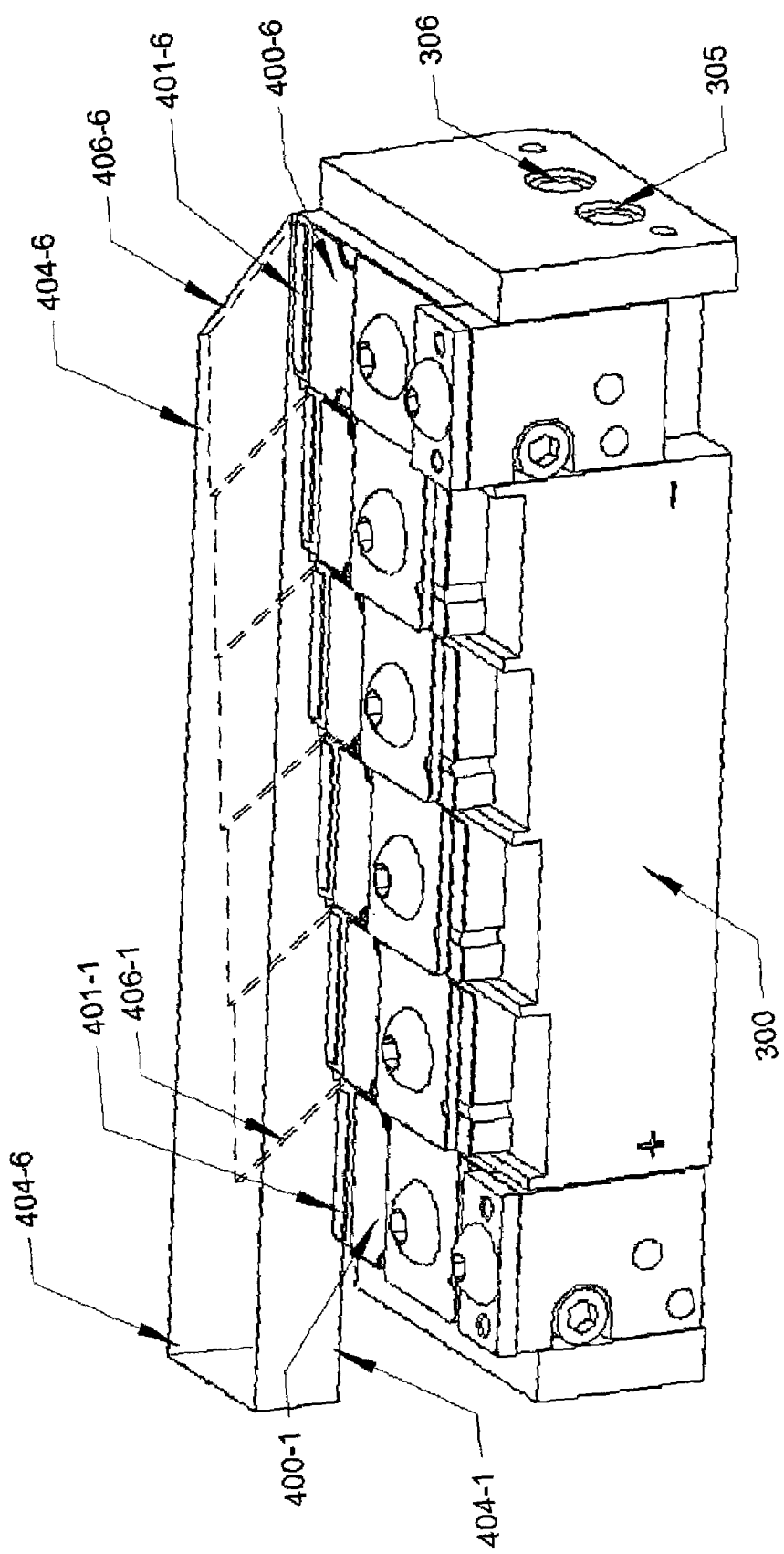
FIG. 4 shows the manifold of FIG. 3 assembled with its array of microchannel heat sinks.

Referring now to FIG. 4 there is shown the manifold 300 together with its associated copper microchannel heat sinks 400-1 through 400-6. Each heat sink mounts a respective laser diode bar 401-1 through 401-6 at its far edge. To simplify the drawing the "jumper" wires leading to the laser diode bars, the standoff insulators and the terminal on the insulators have been omitted but are similar to those shown in FIG. 2. A series of flat, parallel glass plates 404-1 through 404-6, each having a beveled edge 406-1 through 406-5 advantageously making a 45 degree angle with the axis of the light emitted from the respective laser diode bar is positioned to reflect each light output to the left, the separation between the light output planes being no greater than the height of the "riser" between adjacent steps (planes 301-1 through 301-6) of manifold 300.

What has been described is deemed to be illustrative of the principles of the invention. Further and other modifications will be apparent to those skilled in the art and may be made without, however, departing from the spirit and scope of the invention.

What is claimed is:

1. A manifold for supplying a stack of metallic, microchannel heat sinks each mounting a laser diode bar with coolant fluid, said heat sinks forming part of series-connected electrical path, comprising:

an insulating body having a plurality of offset parallel planes for mounting a respective plurality of said microchannel heat sinks; said planes terminating in coolant channels in fluid communication with corresponding channels in said heat sinks; said coolant channels communicating with adjacent ones of said heat sinks and being separated from each other by at least the width of one of said heat sinks to increase the electrical resistance of said fluid path between adjacent ones of said heat sinks; and a series of stepped optical deflectors for re-arranging the laser beams emitted from the laser diode bars into vertical stack, said stepped optical deflectors comprising glass plates having a beveled edge positioned to receive the light output of a respective one of said laser diodes.

2. A manifold according to claim 1 wherein said parallel planes are minimally offset from each other so as to concentrate the optical power emitted by said laser diode bars.

3. A series-connected stack of metallic fluid-cooled microchannel heat sinks each bearing a respective laser diode bar for emitting optical power,
- an insulating body having a plurality of horizontally offset parallel surfaces for mounting a respective one of said heat sinks; said surfaces having coolant channels in fluid communication with corresponding channels in said heat sinks; said coolant channels communicating with adjacent ones of said heat sinks being separated from each other by at least the width of one of said heat sinks to increase the electrical resistance of said fluid path between adjacent ones of said heat sinks;
- a plurality of optical reflective surfaces for detecting the optical power emitted by said lasers into a plurality of vertically stacked beams; and
- a series of stepped optical deflectors for re-arranging the laser beams emitted from the laser diode bars into vertical stack, said stepped optical deflectors comprising glass plates having a beveled edge positioned to receive the light output of a respective one of said laser diodes.

4. An assembly for providing a concentrated, vertically stacked array of laser beams from a horizontally offset array of electrically serially-connected metallic microchannel heat sinks each bearing a laser diode bar, comprising:
- a coolant channel bearing a manifold having horizontally offset planes each mounting a respective one of said heat sinks; the coolant channels serving adjacent ones of said heat sinks being separated from one another to increase the electrical resistance of the fluid path between adjacent ones of said heat sinks; and
- a series of stepped optical deflectors for re-arranging the laser beams emitted from the laser diode bars into vertical stack, said stepped optical deflectors comprised of glass plates having a beveled edge positioned to receive the light output of a respective one of said laser diodes.

5. An assembly according to claim 4 wherein said manifold is manufactured from insulating material.

6. An assembly of claim 5 wherein the coolant in said channels is water.

* * * * *